United States Patent
Taguchi

(10) Patent No.: US 10,109,561 B2
(45) Date of Patent: Oct. 23, 2018

(54) SEMICONDUCTOR DEVICE HAVING PLATED OUTER LEADS EXPOSED FROM ENCAPSULATING RESIN

(71) Applicant: SEIKO INSTRUMENTS INC., Chiba-shi, Chiba (JP)

(72) Inventor: Yasuhiro Taguchi, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 64 days.

(21) Appl. No.: 14/641,491

(22) Filed: Mar. 9, 2015

(65) Prior Publication Data

US 2015/0255378 A1    Sep. 10, 2015

(30) Foreign Application Priority Data

Mar. 10, 2014   (JP) .................................. 2014-046883

(51) Int. Cl.
*H01L 23/52*    (2006.01)
*H01L 23/48*    (2006.01)
(Continued)

(52) U.S. Cl.
CPC .... *H01L 23/49541* (2013.01); *H01L 21/4842* (2013.01); *H01L 23/49551* (2013.01); *H01L 24/85* (2013.01); *H01L 23/3107* (2013.01); *H01L 24/32* (2013.01); *H01L 24/48* (2013.01); *H01L 24/49* (2013.01); *H01L 24/73* (2013.01); *H01L 2224/05554* (2013.01); *H01L 2224/32013* (2013.01); *H01L 2224/32245* (2013.01); *H01L 2224/48091* (2013.01); *H01L 2224/48247* (2013.01); *H01L 2224/48465* (2013.01); *H01L 2224/49175* (2013.01); *H01L 2224/73265* (2013.01); *H01L 2924/00014* (2013.01); *H01L 2924/181* (2013.01)

(58) Field of Classification Search
CPC ......... H01L 23/49541; H01L 23/49551; H01L 21/4842; H01L 21/56; H01L 24/85; H01L 23/3107; H01L 2924/181; H01L 2924/00014; H01L 23/49517; H01L 23/3114; H01L 21/4825
USPC ........ 257/676, 666, 690, 692, 693, 730, 787
See application file for complete search history.

(56) References Cited

U.S. PATENT DOCUMENTS 4,801,997 A * 1/1989 Ono ................... H01L 23/49541
                                                174/530
5,710,064 A * 1/1998 Song ................... H01L 23/4334
                                                257/666

(Continued)

OTHER PUBLICATIONS

Patent Abstracts of Japan, Publication No. 07-045769, Publication Date Feb. 14, 1995.

(Continued)

*Primary Examiner* — Kimberly Rizkallah
*Assistant Examiner* — Dilinh Nguyen
(74) *Attorney, Agent, or Firm* — Adams & Wilks

(57) ABSTRACT

A semiconductor device has a semiconductor chip mounted on an island of a lead frame and covered by an encapsulating resin. An outer lead extends from the encapsulating resin and is connected within the encapsulating resin to an inner lead connected to an inner lead suspension lead. A plated film is plated on the exposed surfaces of the outer lead that extend from the encapsulating resin to improve solder bonding strength of the semiconductor device onto a substrate.

10 Claims, 5 Drawing Sheets

(51) Int. Cl.
*H01L 23/495* (2006.01)
*H01L 23/00* (2006.01)
*H01L 21/48* (2006.01)
H01L 23/31 (2006.01)

(56) References Cited

U.S. PATENT DOCUMENTS

| | | | | |
|---|---|---|---|---|
| 6,034,422 | A * | 3/2000 | Horita | H01L 23/49582 |
| | | | | 257/666 |
| 6,593,643 | B1 * | 7/2003 | Seki | H01L 23/49582 |
| | | | | 257/677 |
| 2003/0116842 | A1 * | 6/2003 | Motonami | H01L 23/49586 |
| | | | | 257/692 |
| 2005/0285240 | A1 * | 12/2005 | Miyake | H01L 21/4842 |
| | | | | 257/676 |
| 2008/0284008 | A1 * | 11/2008 | Urushihata | H01L 23/4952 |
| | | | | 257/735 |
| 2009/0102029 | A1 * | 4/2009 | Tadaoka | H01L 23/49524 |
| | | | | 257/673 |
| 2012/0108013 | A1 * | 5/2012 | Fujisawa | B23K 26/4065 |
| | | | | 438/123 |
| 2013/0140714 | A1 * | 6/2013 | Numazaki | H01L 23/495 |
| | | | | 257/782 |

OTHER PUBLICATIONS

Patent Abstracts of Japan, Publication No. 2006-019465, Publication Date Jan. 19, 2006.

* cited by examiner

SEMICONDUCTOR DEVICE HAVING PLATED OUTER LEADS EXPOSED FROM ENCAPSULATING RESIN

BACKGROUND OF THE INVENTION

1. Field of the Invention

The present invention relates to a semiconductor device using a lead frame and a method of manufacturing the same.

2. Description of the Related Art

A portable electronic device has been downsized in recent years, and a semiconductor package to be used in a semiconductor device has accordingly been required to be downsized and thinned while securing a mounting strength. Employing a surface mount package has been known as a measure for downsizing the semiconductor package, in which an external terminal protrudes in parallel to a substrate mounting surface. Examples of this package type include a small outline non-lead package (SON) and a quad flat non-lead package (QFN).

Those packages have a feature in that an external electrode required for mounting the package on a substrate is smaller than that of a dual inline package (DIP) or a small outline package (SOP), and hence a small amount of solder fillet is formed after the package is mounted on the substrate, and a mounting strength is low. Further, those packages are often manufactured with use of a lead frame produced by using a stamping mold or etching process. As a material of the lead frame, a 194 alloy or a copper alloy is used in general.

In manufacturing of the semiconductor device using the lead frame, a semiconductor chip is mounted on the lead frame, and the semiconductor chip and the lead frame are electrically connected to each other via wires. The resultant structure is then subjected to resin encapsulation process and deburring process, and exterior plating process is carried out on the copper surface. After the exterior plating process, the semiconductor device is cut off from the lead frame so as to have a predetermined size.

As described above, the semiconductor device is cut off from the lead frame after the exterior plating process, and hence no exterior plated film is formed on a cut surface of an outer lead. Accordingly there arises a problem that the solder wetting is poor when the semiconductor device is mounted on the substrate. In order to improve the mounting strength of the semiconductor package produced under such conditions, it is proposed that the shape of an outer lead distal end portion be changed in plan view or cross-sectional view so that the solder wetting after the semiconductor device is mounted on the substrate is improved and a solder fillet is thus easily formed, to thereby increase the mounting strength (for example, see Japanese Patent Application Laid-open Nos. 2006-19465 and Hei 7-45769).

However, along with the progress in downsizing and thinning of a semiconductor device, it is required to further improve the substrate mounting strength of the semiconductor device.

SUMMARY OF THE INVENTION

The present invention provides a semiconductor device having improved solder bonding strength onto a substrate, and a method of manufacturing the same.

In order to solve the problem described above, the following measures are taken.

First, according to one embodiment of the present invention, there is provided a semiconductor device, including: an encapsulating resin for covering a semiconductor chip mounted on an island of a lead frame; an outer lead extending from a side surface of the encapsulating resin; an inner lead connected to the outer lead; an inner lead suspension lead that is connected to the inner lead and extends from the encapsulating resin; and a plated film formed on all of surfaces of the outer lead.

Further, in the semiconductor device, the inner lead suspension lead is exposed from the encapsulating resin.

Further, in the semiconductor device, the island and the inner lead are set higher with respect to the outer lead in the lead frame.

Further, in the semiconductor device, the lead frame, the island, and the outer lead have the same height, and only the inner lead is set higher.

Further, according to one embodiment of the present invention, there is provided a method of manufacturing a semiconductor device including: an encapsulating resin for covering a semiconductor chip mounted on an island of a lead frame; and an outer lead extending from a side surface of the encapsulating resin, the method including: preparing a lead frame including the island, an inner lead close to the island, an inner lead suspension lead and the outer lead that are connected to the inner lead, and an island suspension lead connected to the island; die-bonding, wire-bonding, and resin encapsulating the semiconductor chip; cutting a distal end of the outer lead; forming, by electrolytic plating, a plated film on a cut surface of the outer lead; and cutting the inner lead suspension lead and the island suspension lead.

Further, the method of manufacturing a semiconductor device further includes testing electrical characteristics between the cutting the inner lead suspension lead and the cutting the island suspension lead.

According to one embodiment of the present invention, when the semiconductor device is mounted on the substrate, a thick solder layer is formed on all of the surfaces of the outer lead exposed from the encapsulation resin, and hence the semiconductor device can be firmly bonded to the substrate.

DETAILED DESCRIPTION OF THE INVENTION

Now, the present invention is described with reference to the drawings.

Figure 1:
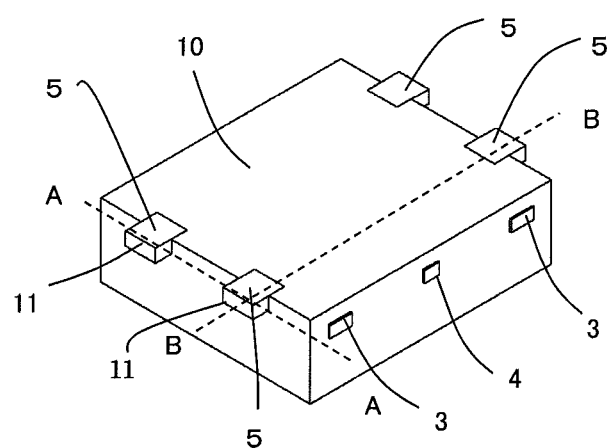
FIG. 1 is a perspective view illustrating a semiconductor device according to an embodiment of the present invention with an outer lead being illustrated on the upper side.

FIG. 1 is a perspective view illustrating a semiconductor device according to an embodiment of the present invention, in which an outer lead 5 is illustrated on the upper side. The outer lead 5 has an upper surface (mounting surface), an end surface (outer lead cut surface 11), a surface opposite to the upper surface (mounting surface), and side surfaces each of which forms right angles with the mounting surface, the opposite surface, and the outer lead cut surface 11 in general. The outer lead 5 extends from an encapsulating resin 10. Further, on a side surface of the substantially cuboid semiconductor device, inner lead suspension leads 3 and an island suspension lead 4 have been cut to expose the cut surfaces from the encapsulating resin 10.

Figure 2:
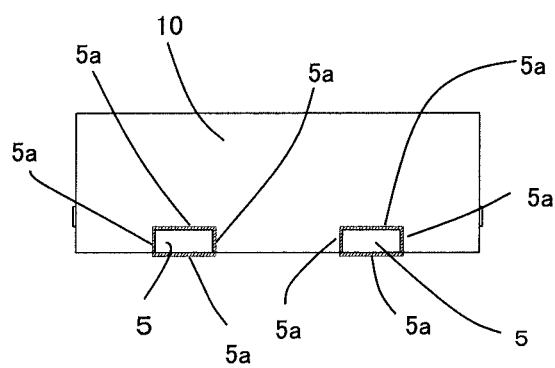
FIG. 2 is a sectional view taken along the line A-A of FIG. 1 (with the outer lead being illustrated on the lower side).

FIG. 2 is a sectional view taken along the line A-A of FIG. 1, in which the outer lead 5 is illustrated on the lower side and the lower surface of FIG. 2 corresponds to the mounting surface used for mounting the semiconductor device on a substrate. A plated film 5a is formed on all surfaces of the outer lead 5 not covered by the encapsulating resin 10. Namely, all of the lower surface on the substrate mounting side, the upper surface opposite to the lower surface, the side surfaces, and the end surface being the cut surface are covered with the plated film 5a.

Figure 3:
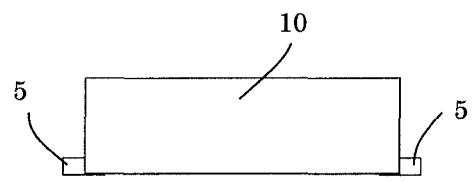
FIG. 3 is a sectional view taken along the line B-B of FIG. 1 (with the outer lead being illustrated on the lower side).

FIG. 3 is a sectional view taken along the line B-B of FIG. 1, in which the outer lead 5 is illustrated on the lower side and the lower surface of FIG. 3 corresponds to the mounting surface used for mounting the semiconductor device on a substrate. The lower surface on the substrate mounting surface side, the upper surface opposite to the lower surface, and the outer lead cut surface 11 of the outer lead 5 are exposed from the encapsulating resin. The plated film 5a covers all of the exposed surfaces of the outer lead.

Figure 4:
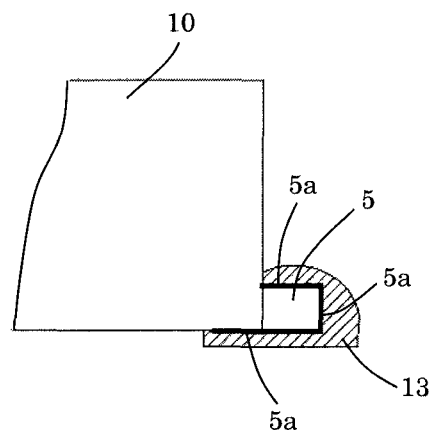
FIG. 4 is a sectional view of the semiconductor device of the present invention in which the outer lead is soldered.

FIG. 4 is a sectional view of the semiconductor device of the present invention in which the outer lead is soldered. A solder layer 13 covers all of the surfaces of the outer lead 5 exposed from the encapsulating resin 10 through intermediation of the plated film 5a, and the semiconductor device and the substrate are thus firmly connected to each other. This is because all of the surfaces of the outer lead 5 exposed from the encapsulating resin 10 are applied with the plated film 5a. The semiconductor device can be firmly connected to the substrate even if the outer lead is slightly exposed.

Next, a method of manufacturing the semiconductor device of the present invention is described.

FIGS. 5A to 5F are perspective views each illustrating a method of manufacturing the semiconductor device according to the embodiment of the present invention.

Figure 5A:
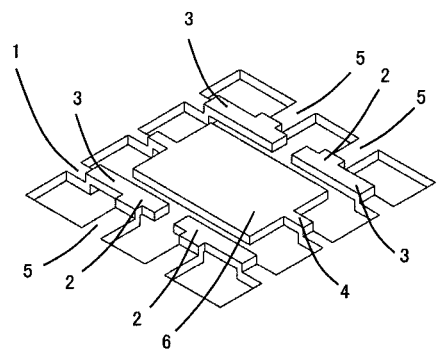
FIGS. 5A to 5F are perspective views each illustrating a method of manufacturing the semiconductor device according to the embodiment of the present invention.

FIG. 5A is a perspective view of a lead frame 1 of this embodiment. The lead frame 1 includes an island 6 to be used for mounting a semiconductor chip, inner leads 2 arranged so as to be separated from the island 6, and the outer leads 5 connected to the respective inner leads 2. Further, the inner lead 2 and the island 6 are connected to a lead frame rim by the inner lead suspension lead 3 and the island suspension lead 4, respectively. The number of the inner lead suspension leads 3 and the number of the inner leads 2, which correspond to each other on a one-to-one basis, are the same. As a matter of course, the number of the inner lead suspension leads 3 and the number of the outer leads 5 are also the same.

Figure 5B:
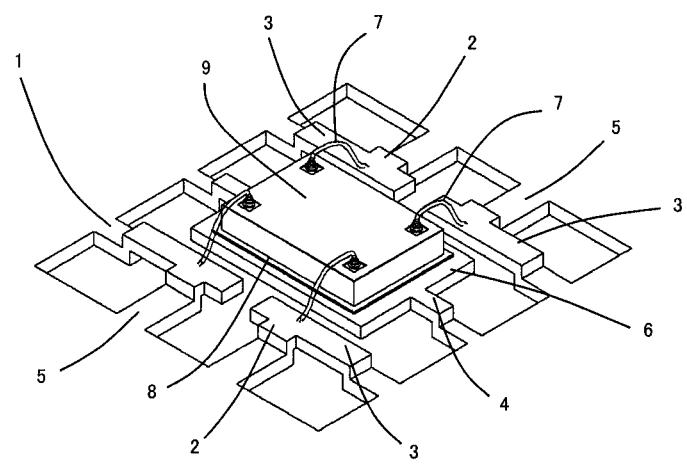

A stepped portion is formed between the inner lead 2 and the outer lead 5, which are continuous with one another, so that the lower surface of the outer lead is lower than a lower surface of the inner lead. As shown in FIGS. 1 and 5B, the island 6 and the inner lead 2 are positioned at a different height from that of the outer lead 5 in the thickness direction (vertical direction in the drawings) of the semiconductor device. The lower surface of the inner lead and a lower surface of the island have the same height. The inner lead suspension lead 3 and the island suspension lead 4 each have a folded portion. Thus, a portion of a lower surface of the inner lead suspension lead 3, which is connected to the lead frame rim surrounding it, is relatively lower than a portion of the lower surface of the inner lead suspension lead 3, which is connected to the inner lead 2. For the island suspension lead 4, similarly, a portion of a lower surface of the island suspension lead 4, which is connected to the lead frame rim surrounding it, is relatively lower than a portion of the lower surface of the island suspension lead 4, which is connected to the island 6.

In other words, the lead frame of this embodiment is a lead frame in which the island and the inner leads are set higher. The lead frame 1 described above can be formed by die stamping and embossing a plate that has a predetermined thickness and is made of a 194 alloy material or a copper alloy. In other words, the plate is stamped for determining planar shapes of the island 6, the inner lead 2, the outer lead 5, the inner lead suspension lead 3, and the island suspension lead 4. As shown in FIG. 5A, the outer lead 5, the inner lead 2 and the inner lead suspension lead 3, which are stamped from the same plate, constitute a one-piece lead structure.

Next, the plate is upwardly embossed so that the island 6, the inner lead 2, a portion of the inner lead suspension lead 3, and a portion of the island suspension lead 4 are relatively higher than other portions. At this time, a step is formed between the inner lead 2 and the outer lead 5. At the same time, a folded portion is formed to each of the inner lead suspension lead 3 and the island suspension lead 4.

FIG. 5B is a perspective view of a semiconductor device after a wire-bonding process. A semiconductor chip 9 is die-bonded on the island 6 of the shaped lead frame 1 through intermediation of a paste 8. Then, an electrode pad formed on the surface of the semiconductor chip and the inner lead 2 are electrically connected to each other via a wire 7.

Figure 5C:
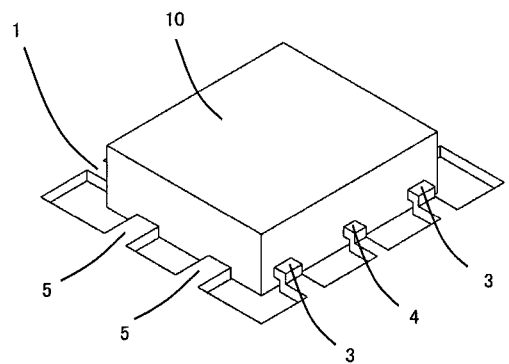

FIG. 5C is a perspective view of a semiconductor device after a resin encapsulating process. The semiconductor chip 9, the wire 7, the inner lead 2, and the exposed portion of the island are encapsulated by the encapsulating resin 10 so as to be covered therewith. Although not illustrated, the lower surface of the island 6 is also covered with the encapsulating resin 10. The outer lead 5, the inner lead suspension lead 3, and the island suspension lead 4 are partially exposed from the encapsulating resin 10 to be connected to the lead frame rim. At this time, the folded portions of the inner lead suspension lead 3 and the island suspension lead 4 also protrude from the encapsulating resin 10 to the outside.

Figure 5D:
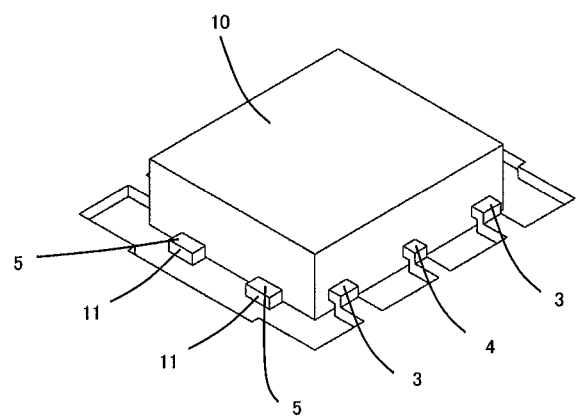

FIG. 5D is a perspective view of a semiconductor device after an outer lead cutting process. A distal end portion of the outer lead 5, which is exposed from a side surface of the encapsulating resin 10, is cut so that the outer lead 5 is separated off from the lead frame rim, to thereby form the cut surface 11. At this time, on another side surface of the encapsulating resin 10, the inner lead suspension lead 3 and the island suspension lead 4 are partially exposed from the encapsulating resin 10 and connected to the lead frame rim. For this reason, the lead frame rim and the outer lead cut surface 11 maintain the electrical connection between them. When electrolytic plating is applied to the exterior in this state, the plated film is formed not only on the upper surface, the bottom surface, and the side surfaces of the outer lead 5, but also on the cut surface 11.

Figure 5E:
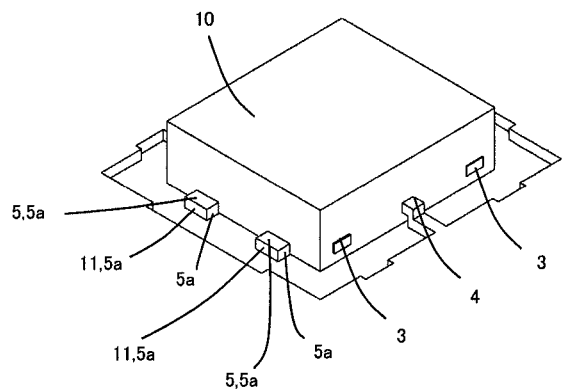
Figure 5F:
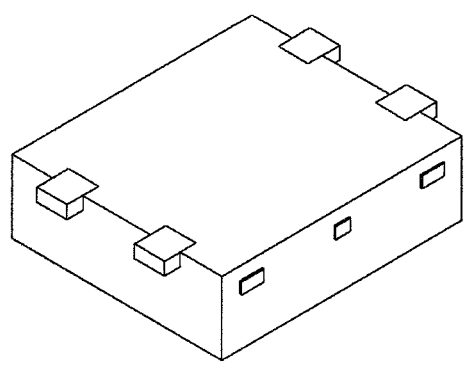

FIG. 5E is a perspective view of a semiconductor device after the inner lead suspension lead 3 is cut through the exterior plating process. A plated film 5a is formed on the surface of the outer lead 5, and the inner lead suspension lead 3, which is no longer needed, is cut to be separated off from the lead frame rim. However, the island suspension lead 4 is still connected to the lead frame rim, and hence a plurality of semiconductor devices is mounted on one lead frame. An efficient test can be made by performing electrical characteristics test (strip test) in this state. After that, the island suspension lead 4 is separated off to singulate the semiconductor devices, thereby obtaining a shape illustrated in FIG. 5F.

Through the manufacturing method described above, the plated film is formed on all of the surfaces of the outer lead, and hence the semiconductor device capable of firmly connecting to the substrate can be obtained.

In the above description, the lead frame in which the island and the inner lead are set higher is exemplified, but a semiconductor device may be manufactured with use of a lead frame in which no stepped portion or folded portion is formed, and the island, the inner lead, the outer lead, and the lead frame rim have the same height. Further, a semiconductor device may be manufactured with use of a lead frame in which the island, the outer lead, and the lead frame rim have the same height and only the inner lead is set higher.

What is claimed is:

1. A semiconductor device, comprising:
   a semiconductor chip mounted on an island;
   an encapsulating resin having a plurality of side surfaces and covering the semiconductor chip;
   an outer lead extending from a lower surface and a first side surface of the encapsulating resin and terminating in a cut surface;
   an inner lead connected to and continuous with the outer lead and positioned at a different height from that of the outer lead by a stepped portion;
   an inner lead suspension lead connected to the inner lead and having a cut surface exposed from a second side surface which is different from the first side surface of the encapsulating resin, the cut surface of the inner lead suspension lead being exposed from the second side surface at a same height as that of the inner lead;
   an island suspension lead connected to the island and having a cut surface exposed from the encapsulating resin; and
   a plated film formed on all surfaces of the outer lead not covered by the encapsulating resin,
   wherein the outer lead, the inner lead and the inner lead suspension lead constitute a one-piece lead structure.

2. A semiconductor device according to claim 1, wherein the cut surface of the inner lead suspension lead and the cut surface of the island suspension lead do not have the plated film thereon.

3. A semiconductor device according to claim 1, wherein the number of the cut surfaces of the inner lead suspension lead exposed from the second side surface of the encapsulating resin and a number of the outer leads are the same.

4. A semiconductor device according to claim 1, wherein the island and the inner lead are positioned at a height different from that of the outer lead in a thickness direction of the semiconductor device.

5. A semiconductor device according to claim 1, wherein the cut surface of the inner lead suspension lead is exposed from the second side surface of the encapsulating resin at a position farther from a bottom of the encapsulating resin than the outer lead extending from the first side surface of the encapsulating resin in a thickness direction of the semiconductor device.

6. A semiconductor device comprising:
   a semiconductor chip mounted on an island;
   outer leads disposed along and spaced from opposite sides of the island;
   inner leads disposed on an inner side of and directly connected to and continuous with respective outer leads and wire-bonded to the semiconductor chip, the inner leads being positioned at a different height from that of the outer leads by a stepped portion;
   inner lead suspension leads directly connected to and continuous with respective inner leads;
   an encapsulating resin covering the semiconductor chip, the island, the inner leads, the wires, part of the outer leads, and part of the inner lead suspension leads, wherein outer end portions of the outer leads extend from first side surfaces of the encapsulating resin and are not covered by the encapsulating resin, and outer end portions of the inner lead suspension leads extend from second side surfaces of the encapsulating resin different from the first side surfaces at a same height as that of the inner leads and are not covered by the encapsulating resin, and wherein respective lower surfaces of the outer leads extend from a bottom surface of the encapsulating resin; and
   a plated film formed on all surfaces of the outer leads not covered by the encapsulating resin.

7. A semiconductor device according to claim 6; further comprising island suspension leads connected to the island and extending from the second side surfaces of the encapsulating resin.

8. A semiconductor device according to claim 6; wherein the outer leads are positioned at a height different from that of the inner lead suspension leads in a thickness direction of the semiconductor device.

9. A semiconductor device according to claim 6; wherein the first side surfaces comprise two opposed first side surfaces of the encapsulating resin, and the second side surfaces comprise two opposed side surfaces of the encapsulating resin.

10. A semiconductor device according to claim 6; wherein each outer lead and a respective one of the inner leads and a respective one of the inner lead suspension leads constitute a one-piece lead structure.

* * * * *